US012627273B2

(12) United States Patent
Barnhill et al.

(10) Patent No.: US 12,627,273 B2
(45) Date of Patent: May 12, 2026

(54) ANALOG INVERTER BASED DC OFFSET CORRECTION CIRCUIT

(71) Applicant: Hewlett Packard Enterprise Development LP, Houston, TX (US)

(72) Inventors: Ryan Barnhill, Fort Collins, CO (US); Jacquelyn Mary Ingemi, Wellington, CO (US); Michael James Marshall, Fort Collins, CO (US); James S. Ignowski, Fort Collins, CO (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 719 days.

(21) Appl. No.: 17/976,713

(22) Filed: Oct. 28, 2022

(65) Prior Publication Data

US 2024/0146264 A1 May 2, 2024

(51) Int. Cl.
*H03F 3/45* (2006.01)

(52) U.S. Cl.
CPC ... *H03F 3/45475* (2013.01); *H03F 2200/375* (2013.01)

(58) Field of Classification Search
CPC .. H03F 3/45475; H03F 2200/375; H03F 1/14; G05F 1/561; H03G 3/30

USPC .......................................................... 330/260
See application file for complete search history.

(56) References Cited

U.S. PATENT DOCUMENTS

| | | | |
|---|---|---|---|
| 6,560,447 B2 | 5/2003 | Rahman et al. | |
| 7,035,351 B1 | 4/2006 | Park et al. | |
| 7,215,266 B2 | 5/2007 | Li et al. | |
| 8,204,466 B2 | 6/2012 | Aytur | |
| 10,897,592 B1 * | 1/2021 | Giduturi | H03G 1/0094 |
| 2007/0103232 A1 * | 5/2007 | Chen | H03F 1/34 330/109 |
| 2021/0211109 A1 | 7/2021 | Daigle et al. | |

* cited by examiner

*Primary Examiner* — Andrea Lindgren Baltzell
*Assistant Examiner* — Jose E Pinero
(74) *Attorney, Agent, or Firm* — Yao Legal Services, Inc.

(57) ABSTRACT

One aspect can provide a direct current (DC) feedback circuit. The DC feedback circuit can include a gain path, a first feedback capacitor coupled, in parallel, to the gain path, and an input resistor coupled to an input of the gain path and the first feedback capacitor. The gain path can include an input stage with a pair of transconductance amplifiers, a gain stage with one or more amplifiers, and an output stage with at least one negative feedback amplifier.

19 Claims, 6 Drawing Sheets

ANALOG INVERTER BASED DC OFFSET CORRECTION CIRCUIT

BACKGROUND

Field

This disclosure is generally related to analog circuit design. More specifically, this disclosure is related to the design of a direct current (DC)-offset-compensation circuit.

BRIEF DESCRIPTION OF THE FIGURES

In the figures, like reference numerals refer to the same figure elements.

DETAILED DESCRIPTION

Figure 1:
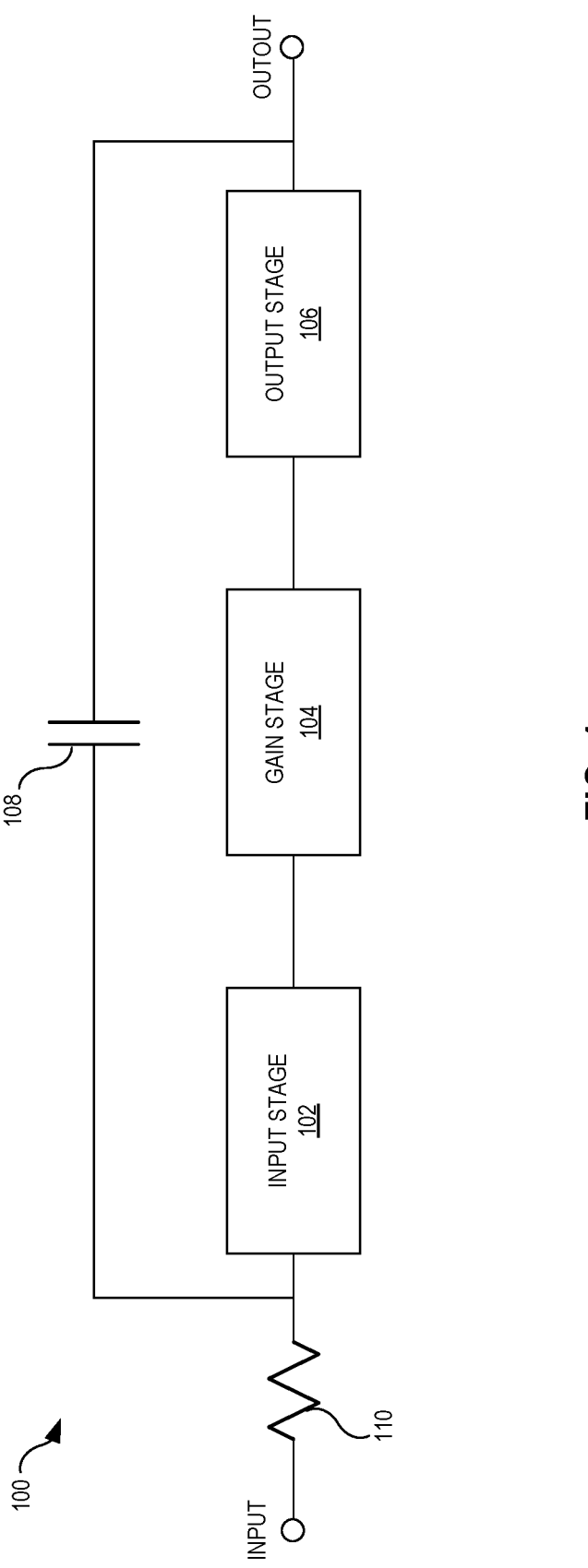
FIG. 1 illustrates an example of the schematic of a DC-offset-compensation circuit, according to one aspect of the instant application.

The following description is presented to enable any person skilled in the art to make and use the embodiments and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown but is to be accorded the widest scope consistent with the principles and features disclosed herein.

Due to random as well as systematic variation in the fabrication process (e.g., the size and property variations of the transistors), analog circuits often suffer from intrinsic offset, such as direct current (DC) offset, which can be a fixed voltage that is permanently present on the signal of interest. Without compensation, the DC offset may saturate the amplifier output stage, which can in turn reduce the amplifier dynamic range and may interfere with the amplification of the desired signal. Moreover, differential signaling is widely used in serializer/deserializer (SerDes) systems, and due to the mismatch between the devices (e.g., amplifiers) in the circuitry processing the two complimentary signals, an offset voltage will be introduced into the differential signals. Such an offset can affect the noise margin of the SerDes systems.

A typical DC-offset-correction or DC-offset-compensation circuit can include a feedback path that feeds back a negative version of the DC component of the output of a to-be-compensated circuit to its input in order to cancel the DC offset at the input. For example, the feedback path can include current-mode logic (CML)-based differential amplifiers that can function as a low-pass filter such that only the DC or close-to-DC component of the output can be fed back to the input. To sufficiently compensate for the DC offset without affecting the signal of interest (e.g., signals at a higher frequency), the cutoff or corner frequency of the feedback circuit should be as close as possible to DC. If the cutoff frequency is not sufficiently low, the DC-offset-correction circuit may end up tracking the data itself (i.e., feeding the data back to the input), potentially causing bit errors. However, the implementation constraints of the high-speed circuit (e.g., the high-speed SerDes) often limit how low the cutoff frequency can be. More particularly, achieving a low cutoff frequency often requires a large capacitor, meaning that the area burden for implementing the DC-offset-compensation circuit can be large and undesirable.

To reduce the area burden that comes with a large capacitor, according to some aspects of the disclosure, instead of using a large capacitor, the DC-offset-compensation circuit can use the Miller effect to increase the equivalent capacitance of a circuit with a smaller capacitor. More particularly, when a capacitor C is connected to both the input and output of an inverting voltage amplifier, due to the application of the effect of the capacitance between the input and output terminals, the input capacitance of the amplifier is increased to $C_M = C(1+A_v)$, where the gain of the inverting voltage amplifier is $-A_v$. According to the Miller effect, the larger the amplifier gain, the larger the amplification of the capacitance. To sufficiently reduce the cutoff frequency of the DC-offset-compensation circuit without a significant area burden, some aspects of the instant application provide a feedback circuit with multiple gain stages.

FIG. 1 illustrates an example of the schematic of a DC-offset-compensation circuit, according to one aspect of the instant application. A DC-offset-compensation circuit 100 can include an input stage 102, a gain stage 104, an output stage 106, a feedback capacitor 108, and a resistor 110.

In addition to providing gain, input stage 102 can provide a certain degree of immunity to process variations and can track the topology of the to-be-compensated circuit (e.g., it has a topology that matches the frontend circuit of the to-be-compensated circuit). According to some aspects, input stage 102 can include a pair of transconductance ($g_m$) amplifiers with different transconductance values. Such a pair of amplifiers can often be referred to as a $g_m/g_m$ amplifier, as the gain of the amplifier is determined by the ratio of the input transconductance (input $g_m$) and load transconductance (load $g_m$). Because the $g_m/g_m$ ratio is relatively immune to process variations (i.e., it remains approximately constant in different processing conditions), the gain provided by input stage 102 can remain approximately constant.

Gain stage 104 can include one or more amplifiers, such as inverting amplifiers (or simply inverters). The number of inverting amplifiers included in gain stage 104 can be determined based on the desired gain as well as the required polarity to implement negative feedback. Depending on the design of input stage 102 and output stage 106 and the coupling mechanism between DC-offset-compensation circuit 100 and the to-be-compensated circuit, the number of inverting amplifiers included in gain stage 104 can be an odd number or an even number. According to one aspect, gain stage 104 can include an odd number (e.g., one, three, etc.) of inverting amplifiers. The total gain of gain stage 104 can be the product of the gains of the inverting amplifiers in gain stage 104.

Output stage 106 can provide compensation for the amplifier path that includes the cascaded amplifier stages in order to maintain stability (e.g., to prevent oscillation and overshoot of the signals) when feedback is applied. According to some aspects, output stage 106 can use the Miller compensation scheme to create a dominant pole for the entire offset-compensation circuit.

Feedback capacitor 108 is the capacitor with its capacitance amplified by the multiple amplifier stages. If the capacitance of feedback capacitor 108 is C and the total gain of the multiple amplifier stages is $A_v$, then the equivalent capacitance of DC-offset-compensation circuit 100 is $C_M=C$ $(1+A_v)$. In one example, the total gain of input stage 102, gain stage 104, and output stage 106 can be greater than 100, and the equivalent capacitance can be greater than 100 times C. Compared with the conventional DC-offset-compensation circuit based on an RC filter, the cutoff frequency of DC-offset-compensation circuit 100 can be reduced by over 100 times, without the area burden of the large capacitor.

Figure 2:
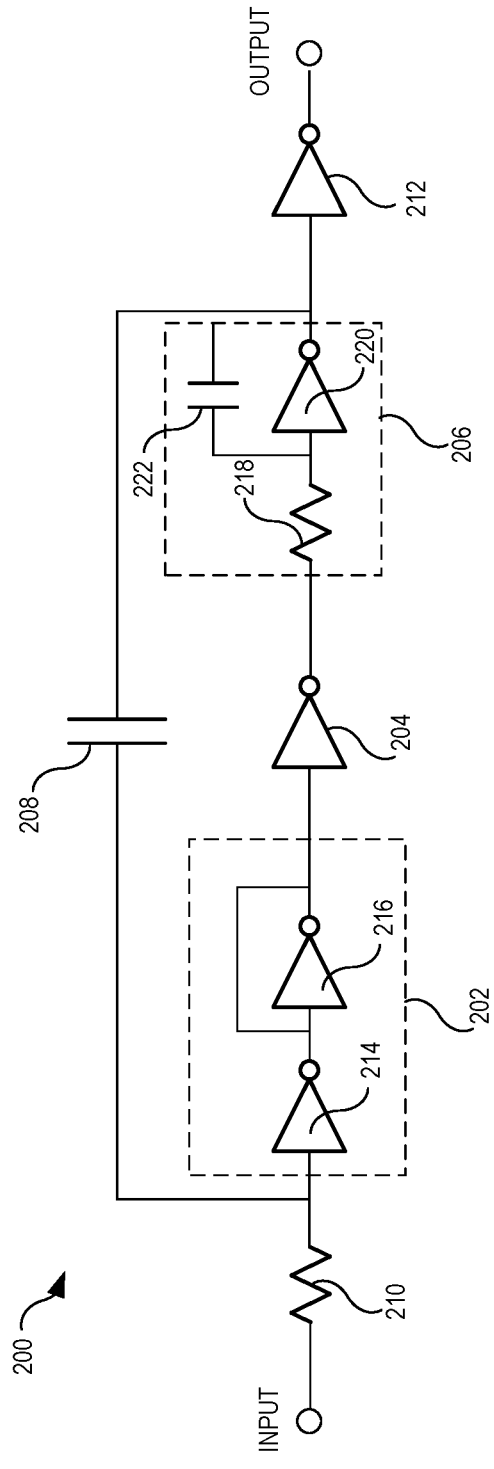
FIG. 2 illustrates an example of a DC-offset-compensation circuit, according to one aspect of the instant application.

FIG. 2 illustrates an example of a DC-offset-compensation circuit, according to one aspect of the instant application. DC-offset-compensation circuit 200 can include a $g_m/g_m$ amplifier 202, an inverting amplifier 204, and a Miller stage 206. More specifically, $g_m/g_m$ amplifier 202 corresponds to input stage 102 shown in FIG. 1, inverting amplifier 204 corresponds to gain stage 104, and Miller stage 206 corresponds to output stage 106. Similar to what is shown in FIG. 1, in addition to the three amplifier stages, DC-offset-compensation circuit 200 can include a feedback capacitor 208 and an input resistor 210. DC-offset-compensation circuit 200 can further include an inverter 212.

$g_m/g_m$ amplifier 202 includes a pair of transconductance amplifiers 214 and 216 that are also inverting amplifiers, with $g_m$ amplifier 214 being the input amplifier coupled to the input of DC-offset-compensation circuit 200 (i.e., the output of the to-be-compensated circuit) and $g_m$ amplifier 216 being the load amplifier. The output of $g_m$ amplifier 216 is directly coupled to its input. The size of $g_m$ amplifier 214 can be several times the size of $g_m$ amplifier 216. The gain of $g_m/g_m$ amplifier 202 can be the ratio of the transconductance ($g_m$) between amplifiers 214 and 216. According to some aspects, the gain of $g_m/g_m$ amplifier 202 can be roughly three. $g_m/g_m$ amplifier 202 can have other possible gain values (e.g., four, five, or higher).

Inverting amplifier 204 can be a high gain amplifier that provides the majority of gains of DC-offset-compensation circuit 200. Miller stage 206 can play an important role in maintaining the stability of DC-offset-compensation circuit 200 by creating a dominant pole for the circuit. According to some aspects, Miller stage 206 can include a resistor 218, an inverting amplifier 220, and a Miller capacitor 222. Note that the resistance of resistor 218 can be much smaller than the resistance of input resistor 210, and the capacitance of Miller capacitor 222 can be much smaller than the capacitance of feedback capacitor 208. According to some aspects, the capacitance of Miller capacitor 222 can be between one and ten picofarads (e.g., 1.4 pF).

Feedback capacitor 208 is coupled between the input of $g_m/g_m$ amplifier 202 and the output of Miller stage 206. The various amplifier stages coupled to feedback capacitor 208 can amplify its capacitance such that, when viewed from the input of DC-offset-compensation circuit 200, the input capacitance of circuit 200 is $C(1+A_v)$, with C being the capacitance of feedback capacitor 208 and $A_v$ being the total gain of the stages 202, 204, and 206. In one example, the capacitance of feedback capacitor 208 can be between a few picofarads (pF) and a few tens of pF, such as between 10 pF and 50 pF. In a further example, the capacitance of feedback capacitor 208 can be about 26 pF. The input capacitance of DC-offset-compensation circuit 200 and the resistance of resistor 210 (which can be about a few hundred kiloohms, e.g., 135 kΩ) can determine the cutoff frequency of DC-offset-compensation circuit 200. According to some aspects, the cutoff frequency (i.e., the 3 dB cutoff frequency) of DC-offset-compensation circuit 200 can be between 100 kHz and 1 MHz (e.g., 500 kHz). Note that for high-speed (e.g., beyond 10 GHz) operations, such a cutoff frequency is considered sufficiently close to DC to provide a good compensation to the DC offset without affecting the desired high-speed signals.

Inverter 212 simply inverts the output of Miller stage 206. In order to provide negative feedback to the to-be-compensated circuit, the total number of the inverters (or inverting amplifiers) in all three stages needs to be selected carefully. In the example shown in FIG. 2, considering that inverting amplifier 216 has its input and output shorted, there are a total of four inverters (including inverter 212), meaning that the polarity of the output of inverter 212 is the same as the input of DC-offset-compensation circuit 200. Depending on the application (e.g., the number of inverting stages in the to-be-compensated circuit), additional inverters may be needed. For example, if the number of inverting stages in the to-be-compensated circuit is odd, DC-offset-compensation circuit 200 shown in FIG. 2 with four inverting stages can provide negative feedback. On the other hand, if the number of inverting stages in the to-be-compensated circuit is even, an additional inverting stage may be added to DC-offset-compensation circuit 200 to ensure negative feedback. If more amplifier stages are added to increase the overall gain, the total number of inverting amplifiers should be chosen to ensure that the feedback is negative.

Figure 3:
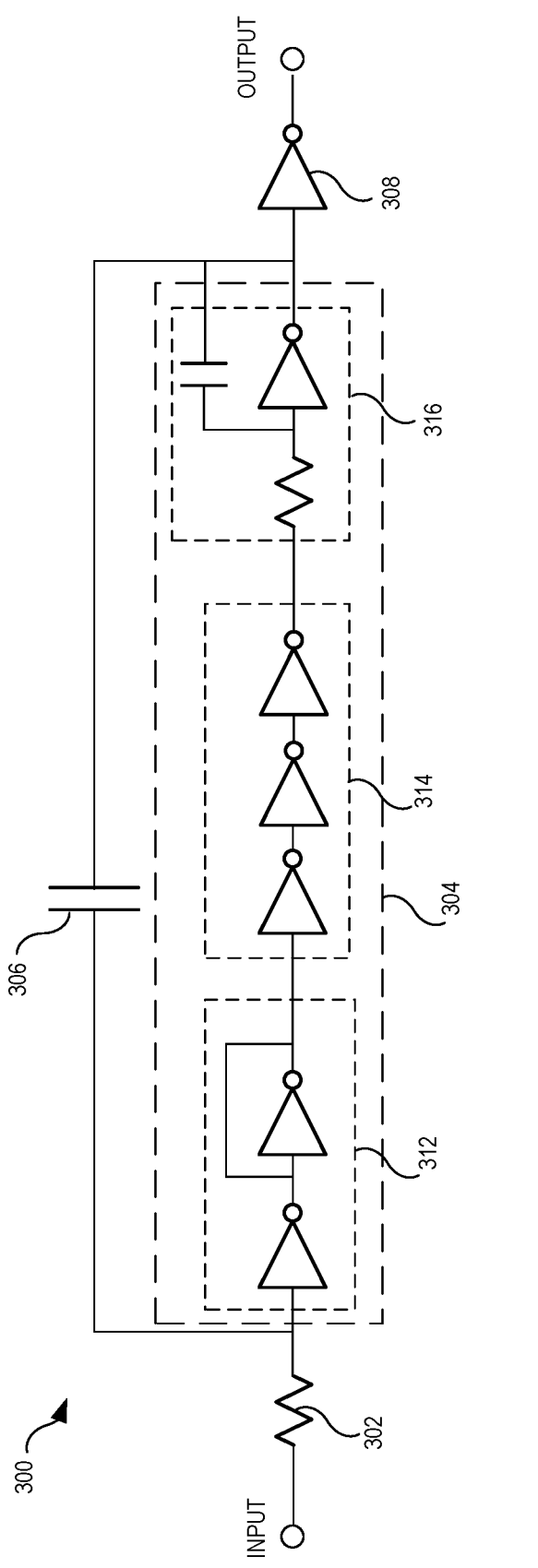
FIG. 3 illustrates an example of a DC-offset-compensation circuit, according to one aspect of the instant application.

FIG. 3 illustrates an example of a DC-offset-compensation circuit, according to one aspect of the instant application. In FIG. 3, DC-offset-compensation circuit 300 includes an input resistor 302, a multi-stage amplifier 304, a feedback capacitor 306, and an inverter 308. More specifically, input resistor 302 is coupled to the input of multi-stage amplifier 304, inverter 308 is coupled to the output of multi-stage amplifier 304, and feedback capacitor 306 is coupled to both the input and output of multi-stage amplifier 304. As discussed previously, according to the Miller effect, the input capacitance of multi-stage amplifier 304 can be determined by the capacitance of feedback capacitor 306 as well as the gain of multi-stage amplifier 304. More particularly, the input capacitance of multi-stage amplifier 304 can be $C(1+A_v)$, with C being the capacitance of feedback capacitor 306 and $A_v$ being the gain of multi-stage amplifier 304.

Multi-stage amplifier 304 can include an input stage 312, a gain stage 314, and an output stage 316. According to some aspects, input stage 312 can include a pair of transconductance amplifiers forming a $g_m/g_m$ amplifier, which can provide DC-offset-compensation circuit 300 with a certain degree of immunity to process variations. The $g_m$ ratio between the two transconductance amplifiers can be between one and ten, such as three. Gain stage 314 can include a number of cascaded high-gain amplifiers. In the example shown in FIG. 3, gain stage 314 includes three cascaded inverting amplifiers. Gain stage 314 can provide the majority of gains needed for the DC-offset compensation. Note that the number of inverting amplifiers included in gain stage 314 can be selected based on the desired gain and the polarity required for the negative feedback. In this example, it is required that there be an odd number (e.g., three) of inverting amplifiers in gain stage 314.

The structure of DC-offset-compensation circuit 300 is similar to DC-offset compensation circuit 200 shown in FIG. 2. The difference between the two circuits is that gain stage 314 in DC-offset-compensation circuit 300 includes multiple amplifiers, and DC-offset-compensation circuit 200 includes only one inverting amplifier 204 in its gain stage. Increasing the number of amplifiers in the gain stage can increase the total gain of the DC-offset-compensation circuit, which can then lead to an even larger equivalent capacitance and a lower cutoff frequency. While increasing the gain, one should also pay attention to the stability of the circuit (e.g., to ensure that the cascaded amplifiers remain stable). In the examples shown in FIGS. 2 and 3, the amplifier(s) in gain stage 304 are inverting amplifiers. In practice, non-inverting amplifiers can also be used, as long as the total number of inverters in the entire circuit satisfies the negative feedback condition.

The DC-offset-compensation circuit can be used in various situations. For example, in addition to the high-speed SerDes, the DC-offset-compensation circuit can be used to compensate for the DC offset in other types of circuits, which may operate in lower or higher frequencies and require different cutoff frequencies of the DC-offset-compensation circuit. According to some aspects, the total gain of the DC-offset-compensation circuit can be adjustable such that the cutoff frequency can be tunable.

Figure 4:
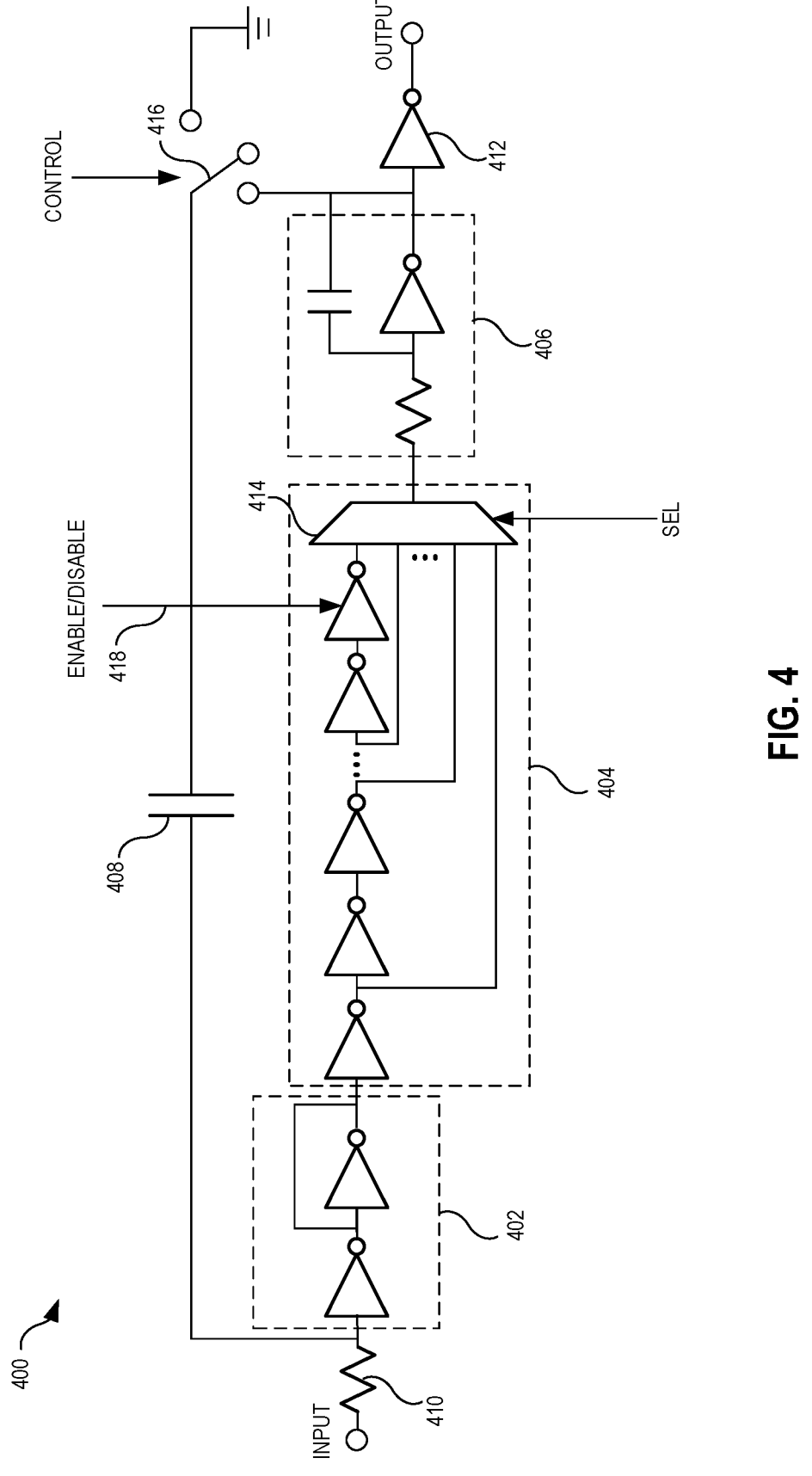
FIG. 4 illustrates an example of a DC-offset-compensation circuit, according to one aspect of the instant application.

FIG. 4 illustrates an example of a DC-offset-compensation circuit, according to one aspect of the instant application. In FIG. 4, DC-offset-compensation circuit 400 can include three amplifier stages: an input stage 402, an adjustable gain stage 404, and a Miller stage 406. DC-offset-compensation circuit 400 can also include a feedback capacitor 408, an input resistor 410, and an inverter 412.

Input stage 402 and Miller stage 406 can be similar to the corresponding stages shown in FIG. 2 and FIG. 3. However, compared with gain stage 314 shown in FIG. 3 that has a fixed gain, adjustable gain stage 404 can provide an adjustable gain. In the example shown in FIG. 4, adjustable gain stage 404 can include a number of cascaded inverting amplifiers and a selector switch 414. According to some aspects, selector switch 414 can include a bank of pass/transmission gates with only one gate being turned on at all times. In the example shown in FIG. 4, every other cascaded inverting amplifiers in gain stage 404 are coupled to selector switch 414, such that the output of selector switch 414 can be the output of an odd number of cascaded inverting amplifiers (e.g., one, three, or five amplifiers, etc.). This can ensure that the gain path is inverting to provide a negative feedback via feedback capacitor 408 to achieve the desired effect of boosting the capacitance of feedback capacitor 408. Selector switch 414 can receive a selection signal from a digital control logic (not shown in FIG. 4) to select a desired number of cascaded inverting amplifiers in adjustable gain stage 404 to be included in the gain path. This way, the total gain of adjustable gain stage 404 can be adjusted by the selection signal. When more amplifiers are selected, the total gain is higher. According to some aspects, a minimum number (e.g., one) of amplifiers in adjustable gain stage 404 can be initially included in the gain path. Once the circuit is deployed, depending on the desired gain, the digital logic can select a desired number of amplifiers to be included in the gain path and send a corresponding selection signal to selector switch 414.

In addition to using a selector switch to select how many amplifiers to be included in the gain path, according to alternative aspects, one or more amplifiers in adjustable gain stage 404 can have an adjustable gain, such that a control circuit can individually adjust the gain of those adjustable-gain amplifiers in order to adjust the total gain of gain stage 404. According to some aspects, one or more inverting amplifiers in gain stage 404 can also be controlled by an enable/disable signal (e.g., signal 418), which qualifies the power to each inverting amplifier. When an inverting amplifier is not included in the gain path, the amplifier can be disabled or be placed in a tri-state mode (i.e., its path to power is disconnected). This can provide power saving, as the amplifiers are not contributing to the total gain and can be tuned off. In one example, an inverting amplifier can include a p-channel field-effect transistor (FET) coupled to the power source, and the enable/disable signal can turn on/off the p-channel FET to connect/disconnect power to the amplifier.

In addition to adjusting the total gain of gain stage 404, it is also possible to disable the coupling between feedback capacitor 408 and the gain path. When feedback capacitor 408 is decoupled from the gain path, the equivalent capacitance of DC-offset-compensation circuit 400 remains the same as the original capacitance of feedback capacitor 408. According to some aspects, feedback capacitor 408 can be coupled to the gain path via a switch 416, and a control logic (not shown in FIG. 4) can send a control signal to switch 416 to couple or decouple feedback capacitor 408 to or from output stage 406. More specifically, one node of switch 416 can be grounded and the other node can be coupled to the output of output stage 406. Switch 416 can be configured to ground feedback capacitor 408 (meaning that its capacitance is not boosted by the gain path) or couple feedback capacitor 408 to output stage 406 (meaning that its capacitance is boosted). This allows a circuit tester to compare the performance of the to-be-compensated circuit when the equivalent capacitance is increased or not. It is also possible to disconnect the entire DC-offset-compensation circuit. For example, the DC-offset-compensation circuit can be coupled to the to-be-compensated circuit via a switch (not shown in FIG. 4), and opening/closing the switch can disconnect/connect the DC-offset-compensation circuit.

Figure 5:
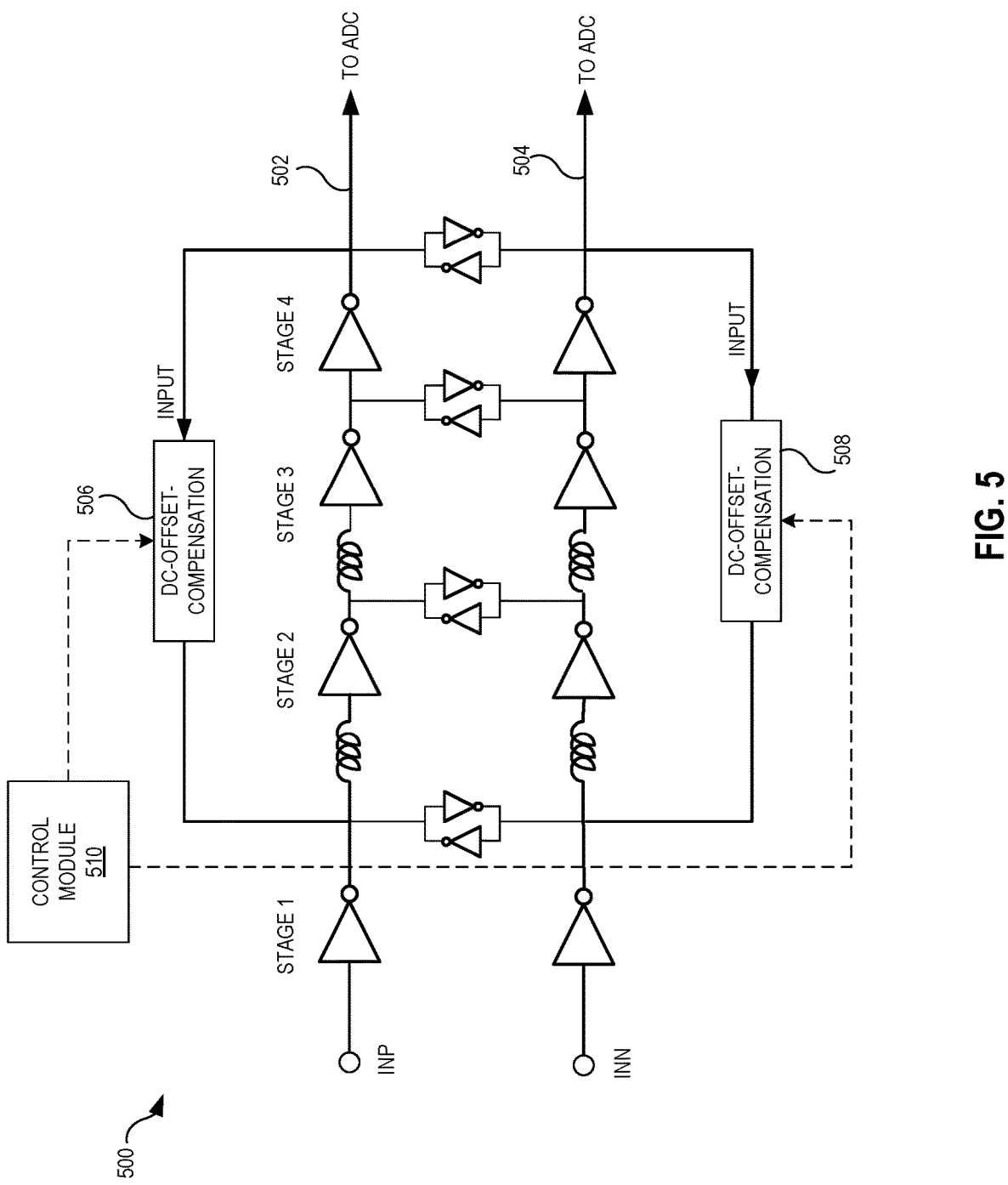
FIG. 5 illustrates an example of a receiver frontend implementing a DC-offset-compensation circuit, according to one aspect of the instant application.

There can be various applications of the DC-offset-compensation circuit. According to some aspects, the DC-offset-compensation circuit can be used to compensate for the DC offset at the frontend of a high-speed receiver (e.g., a high-speed SerDes receiver). FIG. 5 illustrates an example of a receiver frontend implementing a DC-offset-compensation circuit, according to one aspect of the instant application. In this example, frontend circuit 500 of a receiver (e.g., a high-speed SerDes receiver) can include a pair of differential input paths, including a positive input path 502 and a negative input path 504. Each input path can include a number of amplifier stages, such as amplifier stages one through four. According to some aspects, the first two amplifier stages (e.g., stage 1 and stage 2) can be high-frequency continuous time linear equalization (CTLE) amplifiers that can boost the high-frequency gain of the incoming signal, thereby compensating for the low-pass characteristics of the physical medium carrying the incoming signal. The stage 3 amplifier can be a low-frequency CTLE amplifier, and the stage 4 amplifier can be a variable-gain amplifier (VGA).

In the example shown in FIG. 5, a DC-offset-compensation circuit is included at each input path. More specifically, input path 502 can include a DC-offset-compensation circuit 506, and input path 504 can include a DC-offset-compensation circuit 508. In this example, each DC-offset-compensation circuit is coupled to the input of amplifier stage 2 and the output of amplifier stage 4, thus compensating for the DC offset presented to amplifier stages 2 through 4. More specifically, the input to each DC-offset-compensation circuit is coupled to the output of amplifier stage 4, and the output of each DC-offset-compensation circuit is coupled to the input of amplifier stage 2. This way, the DC component of the output of amplifier stage 4 can form negative feedback to the input of amplifier stage 2, thus reducing or eliminating the DC offset. Each DC-offset-compensation circuit 506 can essentially function as a low-pass filter that allows the DC and low-frequency signals to pass while blocking high-frequency signals, thus preventing disturbance to the desired high-frequency signals. According to some embodiments, the receiver can be designed for 100 Gigabit Ethernet (100 GbE), and the cutoff frequency of each DC-feedback circuit can be approximately 500 KHz.

DC-offset-compensation circuits 506 and 508 can be similar to the circuit shown in FIG. 4, and receiver-frontend circuit 500 can further include a control module 510, which can send one or more control signals to each DC-offset-compensation circuit. More specifically, the control signals can be used to enable or disable amplifiers in DC-offset-compensation circuits 506 and 506.

According to some aspects, the DC-offset-compensation circuit can be used to compensate for the DC offset in a circuit that processes 100 Gigabit Ethernet (100 GbE) signals. If the 100 Gb Ethernet signals are distributed over four lanes, each lane may process signals at 25 Gbps. To effectively compensate for the DC offset without affecting the Ethernet signals, the cutoff frequency of the DC-offset-compensation circuit can be designed to be 500 kHz or lower. The cutoff frequency can be determined based on the frequency range of the desired signals. If the frequency range of the desired signals is lower (e.g., less than 10 GHz), the cutoff frequency of the DC-offset-compensation circuit can be lower than 500 kHz. The desired cutoff frequency can determine the desired equivalent capacitance of the circuit, and the total gain of the amplifier stages can be determined based on the desired equivalent capacitance and the size of the feedback capacitor. Note that the size of the feedback capacitor can be determined based on the area constraint.

In the example shown in FIG. 5, each DC-offset-compensation circuit is shown as being coupled to the input of the stage 2 amplifier in an input path of receiver-frontend circuit 500. According to alternative aspects, the last inverter in the DC-offset-compensation circuit (e.g., inverter 412 shown in FIG. 4) can in fact reside within the stage 1 amplifier in the input path. It is also possible to omit this inverter, as long as the total number of inversions in the DC-offset-compensation feedback loop is an odd number to ensure that negative feedback is added to the input of the stage 2 amplifier.

Moreover, in the example shown in FIG. 5, receiver-frontend circuit 500 is shown as having four amplifier stages, and each DC-offset-compensation circuit is coupled to the back three amplifier stages. In this example, the non-inverting DC-offset-compensation circuit 200 shown in FIG. 2 can provide negative feedback to the input. In practice, it is also possible for receiver-frontend circuit 500 to include more or fewer amplifier stages. For example, depending on the implementation, receiver-frontend circuit 500 can include three or five amplifier stages. It is also possible for the DC-offset-compensation circuit to provide DC-offset compensation to more or fewer amplifier stages, as long as the total number of inverting stages in the entire feedback loop can ensure negative feedback. For example, it is possible that the DC-offset-compensation circuit is coupled to the input of the stage 1 amplifier and the output of the stage 4 amplifier, thus providing DC-offset compensation for all four amplifier stages. In this case, the offset-compensation circuit 200 should be inverting. It is also possible that the DC-offset-compensation circuit is coupled to the input of the stage 3 amplifier and the output of the stage 4 amplifier, thus providing DC-offset compensation for these two amplifier stages. Other arrangements are also possible.

Figure 6:
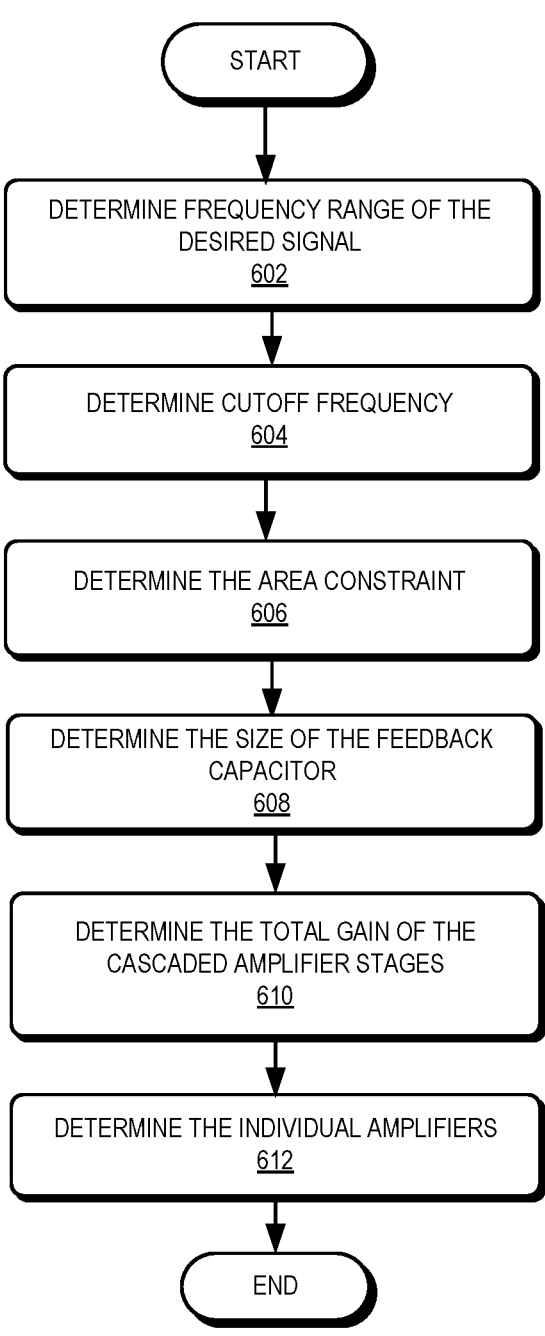
FIG. 6 presents a flowchart illustrating an example of a process for designing a DC-offset-compensation circuit, according to one aspect of the instant application.

FIG. 6 presents a flowchart illustrating an example of a process for designing the DC-offset-compensation circuit, according to one aspect of the instant application. The design process can start with determining the frequency range of the desired signal of the to-be-compensated circuit, such as receiver-frontend circuit 500 (operation 602). Once the frequency range of the desired signal is determined, the cutoff frequency of the DC-offset-compensation circuit (e.g., DC-offset-compensation circuit 200) can be determined (operation 604). The cutoff frequency should be significantly lower than the frequency of the desired signal. For example, if the frequency of the desired signal is 25 GHz or higher, the cutoff frequency can be around 500 kHz.

The design process can also include determining the area constraint (operation 606) and then determining the size of the feedback capacitor (e.g., feedback capacitor 208) based on the area constraint (operation 608). According to some aspects, the capacitance of the feedback capacitor can be a few picofarads (e.g., between 1 pF and 10 pF). The total gain of the cascaded amplifier stages (e.g., amplifier stages 202, 204, and 206) can be determined based on the cutoff frequency and the capacitance of the feedback capacitor (operation 610). Subsequently, the individual amplifiers (e.g., the amplifiers in gain stage 314) in the cascaded amplifier stages can be determined (operation 612). For example, the individual gain of the cascaded amplifiers in the gain stage can be determined based on the total gain and the gains of the input and Miller stages. When inverting amplifiers are used, the total number of inverters should be selected to ensure that negative feedback is provided.

In general, the disclosure provides a solution to the problem of DC offset cancellation. More specifically, the DC-offset-cancellation circuit takes advantage of the Miller effect by coupling a feedback capacitor to the input and output of a number of cascaded amplifier stages in order to increase the equivalent capacitance of the DC-offset-cancellation circuit. Consequently, the DC-offset-cancellation circuit can provide a sufficiently low cutoff frequency without requiring a large capacitor and the area burden caused by the large capacitor. In addition to a gain stage that provides the majority of the gains, the cascaded amplifier stages can include an input stage and an output stage. The input stage can include a $g_m/g_m$ amplifier to provide the circuit with a certain degree of immunity to process variations. The output stage can include a Miller circuit that can ensure stability (e.g., preventing oscillation of the signals) of the DC-offset-cancellation circuit. Compared with approaches that use a large RC filter to set the cutoff frequency, the proposed approach can shrink the filter area as well as lowering the cutoff frequency by several orders of magnitude. Compared with approaches that use a digital control loop to implement the DC-offset correction, the proposed approach is easier to implement and can provide more accurate DC-offset compensation.

One aspect can provide a direct current (DC) feedback circuit. The DC feedback circuit can include a gain path, a first feedback capacitor coupled, in parallel, to the gain path, and an input resistor coupled to an input of the gain path and the first feedback capacitor. The gain path can include an input stage with a pair of transconductance amplifiers, a gain stage with one or more amplifiers, and an output stage with at least one negative feedback amplifier.

In a variation on this aspect, a capacitance of the first feedback capacitor can be between 10 pF and 50 pF.

In a variation on this aspect, a cutoff frequency of the DC feedback circuit can be between 100 kHz and 1 MHz.

In a variation on this aspect, the pair of transconductance amplifiers can be inverting amplifiers, and a transconductance ratio between the pair of transconductance amplifiers can be between one and five.

In a variation on this aspect, the output stage can include a Miller circuit to provide stability to the DC feedback circuit. The Miller circuit can include an inverting amplifier, a second feedback capacitor, and a resistor.

In a further variation, a capacitance of the second feedback capacitor can be smaller than a capacitance of the first feedback capacitor, and a resistance of the resistor in the Miller circuit can be smaller than a resistance of the input resistor.

In a variation on this aspect, the first feedback capacitor can be coupled to the gain path via a switch.

In a variation on this aspect, the gain stage can include a selector switch coupled to one or more amplifiers in the gain stage to allow a subset of amplifiers in the gain stage to be connected to the gain path.

In a variation on this aspect, the amplifiers in the gain stage can include one or more inverting amplifiers, and a total number of inverting amplifiers in the circuit can be determined to ensure that the circuit provides a negative DC feedback.

In a variation on this aspect, the DC-feedback circuit can further include an inverter coupled to an output of the gain path and the first feedback capacitor.

In a variation on this aspect, the input resistor can be coupled to an output of a to-be-compensated circuit, and an output of the gain path can be coupled to an input of the to-be-compensated circuit, thereby allowing the DC-feedback circuit to provide DC-offset compensation to the to-be-compensated circuit.

In a variation on this aspect, the to-be-compensated circuit can be a frontend circuit of a high-speed receiver.

One aspect can provide a high-speed receiver frontend circuit. The frontend circuit can include a plurality of cascaded amplifier stages and a direct current (DC)-offset-compensation circuit coupled to one or more cascaded amplifier stages to provide DC-offset compensation. The DC-offset-compensation circuit can include a gain path, a first feedback capacitor coupled, in parallel, to the gain path, and an input resistor coupled to an input of the gain path and the first feedback capacitor. The gain path can include an input stage with a pair of transconductance amplifiers, a gain stage with one or more amplifiers, and an output stage with at least one negative feedback amplifier.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A direct current (DC) feedback circuit, the circuit comprising:
a gain path;
a first feedback capacitor coupled, in parallel, to the gain path; and an input resistor coupled to an input of the gain path and the first feedback capacitor, the gain path, the first feedback capacitor, and the input resistor forming a first Miller circuit that amplifies a capacitance of the first feedback capacitor;
wherein the gain path comprises an input stage with a pair of transconductance amplifiers, an adjustable gain stage comprising a plurality of cascaded amplifiers, and an output stage;
wherein the adjustable gain stage comprises a selector switch comprising a plurality of pass/transmission gates coupled to the plurality of cascaded amplifiers in the adjustable gain stage;
wherein the output stage comprises a second Miller circuit comprising a second feedback capacitor; and
wherein a capacitance of the second feedback capacitor is smaller than the capacitance of the first feedback capacitor.

2. The DC feedback circuit of claim 1, wherein a capacitance of the first feedback capacitor is between 10 pF and 50 pF.

3. The DC feedback circuit of claim 2, wherein a cutoff frequency of the DC feedback circuit is between 100 KHz and 1 MHz.

4. The DC feedback circuit of claim 1, wherein the pair of transconductance amplifiers are inverting amplifiers, and wherein a transconductance ratio between the pair of transconductance amplifiers is between one and five.

5. The DC feedback circuit of claim 1, wherein the second Miller circuit is to provide stability to the DC feedback circuit, and wherein the second Miller circuit further comprises an inverting amplifier and a resistor.

6. The DC feedback circuit of claim 5, wherein a resistance of the resistor in the second Miller circuit is smaller than a resistance of the input resistor in the first Miller circuit.

7. The DC feedback circuit of claim 1, wherein the first feedback capacitor is coupled to the gain path via a switch.

8. The DC feedback circuit of claim 1, wherein the amplifiers in the gain stage comprise inverting amplifiers, and wherein a total number of inverting amplifiers in the circuit is determined to ensure that the circuit provides a negative DC feedback.

9. The DC feedback circuit of claim 1, further comprising an inverter coupled to an output of the gain path and the first feedback capacitor.

10. The DC feedback circuit of claim 1, wherein the input resistor is coupled to an output of a to-be-compensated circuit, and wherein an output of the gain path is coupled to an input of the to-be-compensated circuit, thereby allowing the DC-feedback circuit to provide DC-offset compensation to the to-be-compensated circuit.

11. The DC feedback circuit of claim 10, wherein the to-be-compensated circuit is a frontend circuit of a high-speed receiver.

12. A high-speed receiver frontend circuit, comprising:
a plurality of cascaded amplifier stages; and
a DC-offset-compensation circuit coupled to one or more cascaded amplifier stages to provide DC-offset compensation;
wherein the DC-offset-compensation circuit comprises:
a gain path;
a first feedback capacitor coupled, in parallel, to the gain path; and
an input resistor coupled to an input of the gain path and the first feedback capacitor, the gain path, the first feedback capacitor, and the input resistor forming a first Miller circuit that amplifies a capacitance of the first feedback capacitor;

wherein the gain path comprises an input stage with a pair of transconductance amplifiers, an adjustable gain stage comprising a plurality of cascaded amplifiers, and an output stage;

wherein the adjustable gain stage comprises a selector switch comprising a plurality of pass/transmission gates coupled to the plurality of cascaded amplifiers in the adjustable gain stage;

wherein the output stage comprises a second Miller circuit comprising a second feedback capacitor; and wherein a capacitance of the second feedback capacitor is smaller than the capacitance of the first feedback capacitor.

13. The receiver frontend circuit of claim 12, wherein a capacitance of the first feedback capacitor is between 10 pF and 50 pF.

14. The receiver frontend circuit of claim 12, wherein the pair of transconductance amplifiers are inverting amplifiers, and wherein a transconductance ratio between the pair of transconductance amplifiers is between one and ten.

15. The receiver frontend circuit of claim 12, wherein the second Miller circuit is to provide stability to the DC-offset-compensation circuit, and wherein the second Miller circuit further comprises an inverting amplifier and a resistor.

16. The receiver frontend circuit of claim 15, wherein a resistance of the resistor in the second Miller circuit is smaller than a resistance of the input resistor in the first Miller circuit.

17. The receiver frontend circuit of claim 12, wherein the first feedback capacitor is coupled to the gain path via a switch.

18. The receiver frontend circuit of claim 12, wherein the amplifiers in the gain stage comprise one or more inverting amplifiers, and wherein a total number of inverting amplifiers in the circuit is determined to ensure that the DC-offset-compensation circuit provides a negative DC feedback to the coupled one or more cascaded amplifier stages.

19. The receiver frontend circuit of claim 12, wherein the DC-offset-compensation circuit further comprises an inverter coupled to an output of the gain path and the first feedback capacitor.

* * * * *